United States Patent [19]

Williams et al.

[11] Patent Number: 5,055,896
[45] Date of Patent: Oct. 8, 1991

[54] SELF-ALIGNED LDD LATERAL DMOS TRANSISTOR WITH HIGH-VOLTAGE INTERCONNECT CAPABILITY

[75] Inventors: Richard K. Williams, Cupertino; Steven H. Bolger, San Jose, both of Calif.

[73] Assignee: Siliconix Incorporated, Santa Clara, Calif.

[21] Appl. No.: 285,842

[22] Filed: Dec. 15, 1988

[51] Int. Cl.$^5$ ............................................. H01L 29/784
[52] U.S. Cl. .................................... 357/23.8; 357/23.4
[58] Field of Search ............................... 357/23.8, 23.4

[56] References Cited

U.S. PATENT DOCUMENTS 4,819,045  4/1989  Murakami ........................... 357/23.8
4,890,146  12/1989 Williams et al. .................... 357/23.8

FOREIGN PATENT DOCUMENTS 69429  1/1983  European Pat. Off. ........... 357/23.8

Primary Examiner—WIlliam D. Larkins
Attorney, Agent, or Firm—Skjerven, Morrill, MacPherson, Franklin & Friel

[57] ABSTRACT

Our invention is an annular-shaped or rectangular-shaped lateral DMOS device which overcomes the problems of field crowding caused by a high voltage drain interconnect line creating an increased electric field in the vicinity of a drift region/channel interface. To prevent the interconnect line voltage from causing field crowding, the drift region is discontinued for a portion under the interconnect line so as to make that part of the DMOS device inactive. Therefore, the portion of the DMOS device under the high voltage drain interconnect is not subject to field crowding and in no way reduces the breakdown voltage of the DMOS device. In one embodiment of this invention, a field oxide region is formed between a channel region and a drain region in an area under and extending out from under where a high voltage drain interconnect is to be formed. Impurities implanted in a subsequent impurity implant process to form the drift region will, therefore, be prevented from entering the silicon under the field oxide region.

5 Claims, 4 Drawing Sheets

SELF-ALIGNED LDD LATERAL DMOS TRANSISTOR WITH HIGH-VOLTAGE INTERCONNECT CAPABILITY

FIELD OF THE INVENTION

This invention relates to high voltage integrated circuit semiconductor devices and more particularly to a self-aligned lightly doped drain lateral DMOS transistor requiring a high voltage interconnect to a drain terminal.

BACKGROUND OF THE INVENTION

High voltage lateral double diffused MOS (DMOS) transistors using a lightly doped drain (LDD) extension (or drift region) are well known in the art.

The various problems associated with high voltage lateral DMOS transistors are illustrated with reference to FIG. 1.

FIG. 1 shows a first generation N-channel LDD lateral DMOS transistor, wherein N− drift region 10 is formed below field oxide region 11, using a well known Local Oxidation of Silicon (LOCOS) technique. In this structure, N+ source region 12 and P+ body contact region 14 are shorted together by metal contact 16. Doped polysilicon gate 18 is formed above and insulated from P body region 20 and P-31 substrate 22. Gate oxide 24 insulates gate 18 from P body region 20 and P substrate 22.

Gate 18 inverts P body region 20 and P− substrate 22 just under gate oxide 24 to create a conducting ohmic channel between N+ source region 12 and N+ drain region 26 when gate 18 has a voltage applied to it above the threshold voltage of the device. N− drift region 10 effectively acts as a resistive extension of N+ drain region 26 when the device is biased to be in its on state.

When the device is in its off state, N− drift region 10 becomes totally or partially depleted and acts to spread the electric field, induced by the voltage differential between the high voltage applied to N+ drain region 26 and the low (e.g., ground) voltage applied to P− substrate 22, over the length of drift region 10. This increases the breakdown voltage of the device by reducing the maximum electric field intensity at the drift region/channel interface 28 (i.e., where drift region 10 meets substrate 22 under gate 18). Drift region 10 thus greatly increases the breakdown voltage of the device albeit with a sacrifice in on-resistance. If higher breakdown voltages are desired, the drift region is typically made longer. This, however, also results in higher on-resistance.

In FIG. 1, gate 18 is extended over field oxide region 11 so as to form field plate 30. Field plate 30, being at a low gate potential, causes the electric field at the drift region/channel interface 28 to be further reduced, thus easing the stress at the drift region/channel interface 28. Additionally, field plate 30 shields the drift region/channel interface 28 from fields produced by overhead interconnect lines.

To further compound the problem of designing a lateral DMOS device with high breakdown voltage but with small surface area and low on-resistance, faults in the crystalline structure at the interface of field oxide region 11 and the silicon exist due to the heating of the silicon during the LOCOS process used to form field oxide 11. This fault in the crystalline structure occurs due to the silicon and silicon nitride (used in the LOCOS process) from expanding at different rates during heating. Consequently, under the silicon nitride the silicon atoms in the crystalline structure are no longer aligned. This contributes to the bird's beak formation at the ends of LOCOS field oxide 11. This fault causes the crystalline structure to have a lower breakdown voltage. The difficulty in forming a high voltage lateral DMOS device is compounded by this problem since where this fault exists is also where the highest electric field exists, that is, at the drift region/channel interface 28.

Another problem in obtaining the desired manufacturing tolerances is that the mask for LOCOS field oxide 11 and gate 18 must be precisely aligned so that the channel region is of the desired length.

One reason for the desirability of the structure of FIG. 1 is that LOCOS field oxide 11 and drift region 10 are formed along with other LOCOS field oxide regions and doped regions which are not being used as drift regions. For example, elsewhere on a semiconductor wafer, an N region underlying a LOCOS field oxide region may be used to separate two P+ regions within an N-well. This N region under the LOCOS field oxide region would then prevent a parasitic MOS transistor from forming, preventing conduction between the two P+ regions due to, for example, an interconnect line passing over the N region carrying a high voltage. Without the N region between the two P+ regions, the line's electric field could invert the lightly doped N well region between the P+ regions causing the parasitic MOS transistor to turn on.

N− drift region 10 and overlying LOCOS field oxide 11 are formed using well-known techniques. Typically, N type dopants are implanted into the surface of the wafer through a mask and the wafer is subjected to a thermal oxide forming process until the LOCOS field oxide has reached the desired thickness.

The structure of FIG. 1 is typically formed as an annular device or a rectangular device concentric around center line CL through N+ drain 26. Thus, N+ source region 12 surrounds N+ drain 26.

A second generation N-channel LDD lateral DMOS transistor is shown in FIG. 2. This device performs essentially the same as the device of FIG. 1 except that N− drift region 10 is formed self-aligned with gate 18, using gate 18 as a mask, and field oxide 32 is formed over the entire surface of the wafer. By eliminating the formation of a LOCOS field oxide near the drift region/channel interface 28, there are no stress-created defects in the crystalline structure at the drift region/channel interface 28. Thus, the structure of FIG. 2 provides an improvement over the structure of FIG. 1. The various regions in FIG. 2 correspond in form and function to those in FIG. 1.

To reduce the electric field stress at the drift region/channel interface 28, field plate 34 is formed over the drift region/channel interface 28 and connected to gate or source potential.

As in the structure of FIG. 1, the structure of FIG. 2 is typically annular or rectangular shaped with a center line through drain region 26 and N+ source region 12 completely surrounding drain region 26.

Due to the annular shape of the DMOS device of FIG. 2, field plate 34 must be opened up to allow an interconnect line from outside the periphery of the DMOS device to contact drain region 26. Forming insulation over field plate 34 to insulate the interconnect line from field plate 34 is not desirable due to the added processing steps and time required to deposit a thick oxide insulator.

FIG. 3 shows a cross-section of the DMOS transistor of FIG. 2 in its off state at a portion where field plate 34 in FIG. 2 is opened to allow high voltage drain interconnect line 36 to extend through the periphery of the DMOS device to a high voltage terminal. Since interconnect line 36 is at a high voltage, and both P− substrate 22 and gate 18 are typically at ground potential, a high electric field exists between high voltage drain interconnect line 36 and both P− substrate 22 and gate 18. This high electric field causes field crowding in the vicinity of drift region/channel interface 28, as shown in FIG. 3. Thus, the DMOS device must be designed so that it does not break down even with this field crowding.

As an example of field crowding, without drain interconnect line 36 overlying N− drift region 10, the voltage at drift region/channel interface 28 is assumed to be 0.2 $V_d$, where $V_d$ is the drain voltage. However, in the case where high voltage drain interconnect 36 is overlying N− drift region 10, the voltage at drift region/channel interface 28 may be as much as 0.7 $V_d$. Exemplary equipotential lines are shown in FIG. 3, where the area with the most crowded lines is the area subject to the highest electric field. As seen, the area with the most crowded lines, and, hence, the area subject to the maximum stress, is in the vicinity of drift region/channel interface 28.

As a consequence of this field crowding, breakdown voltages of DMOS devices using interconnect lines, such as interconnect line 36 in FIG. 3, typically do not exceed 170 volts.

Making field oxide region 32, separating high voltage drain interconnect line 36 from N− drift region 10, thicker helps very little in reducing this high electric field. Thus, the breakdown voltage of the DMOS device of FIGS. 2 and 3 is limited by the portion of the DMOS device where the high voltage drain interconnect line 36 extends through the periphery of the DMOS device.

SUMMARY OF THE INVENTION

Our invention is a lateral DMOS device which overcomes the problems of field crowding described above caused by a high voltage drain interconnect line inducing an increased electric field in the vicinity of the drift region/channel interface. In our invention, to prevent this increased electric field in the vicinity of the drift region/channel interface, a portion of the the drift region is deleted under the interconnect line so as to make that part of the DMOS device inactive. By deleting the portion of the drift region under the high voltage drain interconnect, no field crowding results. Hence, the breakdown voltage of the DMOS device is not reduced by the overhead interconnect line. In one embodiment of this invention, a field oxide region, formed using a well known local oxidation of silicon (LOCOS) process, is located between a channel region and a drain region in an area under where a high voltage drain interconnect is to be formed. Impurities implanted in a subsequent impurity implant process to form the drift region will, therefore, be prevented from entering the silicon under the field oxide region. The LOCOS field oxide thus prevents the drift region from extending to the channel region. Elsewhere around the periphery of the annular or rectangular shaped DMOS device, an active DMOS device is formed wherein the drift region terminates under a gate, and a field plate overlies the drift region/channel interface to lower the electric field strength at the drift region/channel interface and to act as a shield.

DMOS structures incorporating our invention have been fabricated and have exhibited breakdown voltages up to 370 volts.

DETAILED DESCRIPTION

Figure 3:
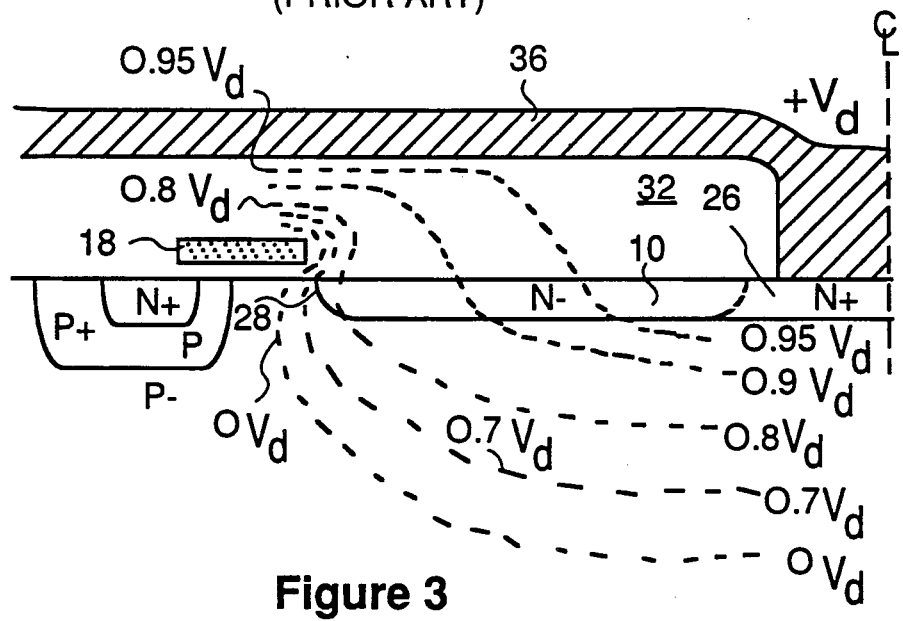
FIG. 3 shows a cross-section of the DMOS transistor of FIG. 2 where the high voltage drain interconnect extends through the periphery of the transistor.
Figure 4A:
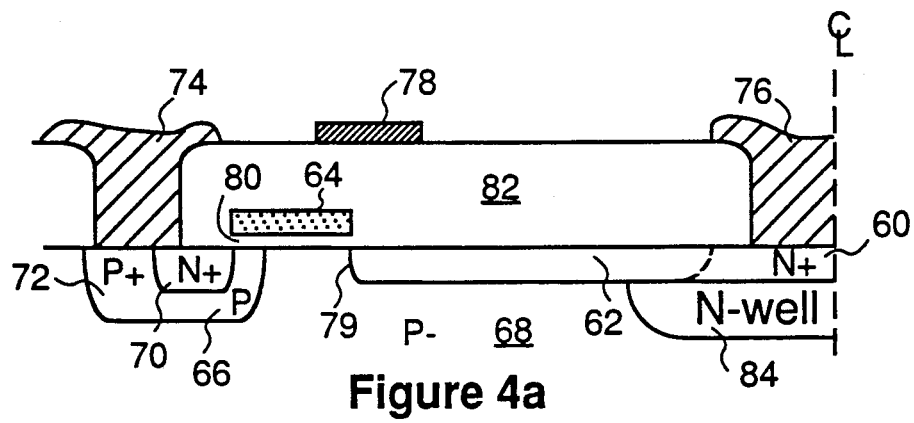
FIG. 4a shows a cross-section of an active portion of our inventive high voltage DMOS transistor.
Figure 4B:
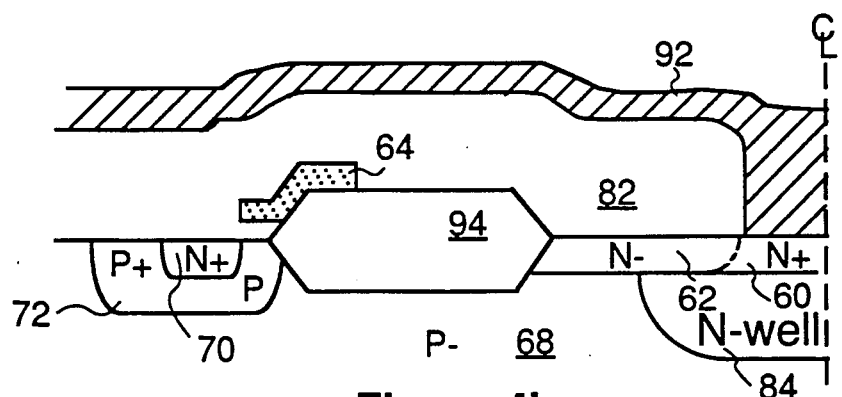
FIG. 4b is a cross-section of an inactive portion of our DMOS transistor where the high voltage drain interconnect line extends through the periphery of the annular-shaped DMOS transistor.
Figure 4C:
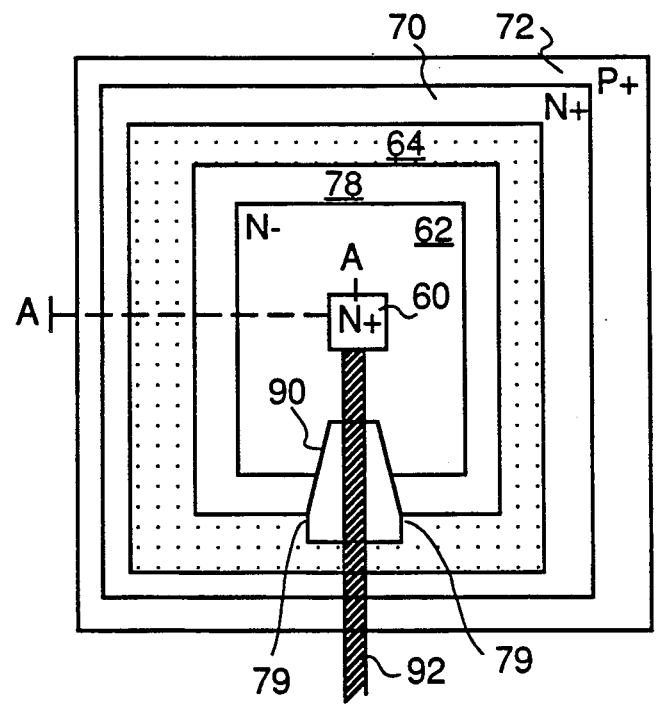
FIG. 4c is a top view of our DMOS transistor.

The problems discussed with reference to FIG. 3 relating to field crowding near the drift region/channel interface are avoided in our invention by making the area of the DMOS transistor under the high voltage drain interconnect line an inactive region so that the breakdown voltage of the DMOS device is substantially unaffected by the high voltage drain interconnect line. FIGS. 4a, 4b, and 4c show one embodiment of this inventive DMOS transistor; however, many other embodiments will become apparent to those of ordinary skill in the art after understanding our invention.

FIG. 4a shows the active part of the DMOS transistor at line A—A in FIG. 4c. Referring to both FIGS. 4a and 4c, N+ drain 60 is located at the center of an annular or rectangular shaped DMOS transistor. In the active part of the device, N− drift region 62 extends from N+ drain 60 to the channel region just under gate 64. The length of N− drift region 62 is determined by the desired breakdown voltage of the device. P body region 66 and P− substrate 68 under gate 64 form the channel region, which is inverted by a sufficient gate-source voltage applied between gate 64 and N+ source region 70.

P+ body contact region 72 insures ohmic contact between metal contact 74 and P body region 66 and insures the shorting of P+ body contact region 72 with N+ source region 70 to prevent N+ source region 70 from becoming forward biased with respect to P body region 66. Metal contact 76 contacts N+ drain 60. Metal field plate 78, coupled to gate or source voltage, acts to reduce the electric field at the drift region/channel interface 79 and also provides shielding.

Gate oxide 80 is of a thickness to achieve the desired threshold voltage. Field oxide 82 provides insulation and a mechanical support structure for metal contacts 74, 76, and field plate 78. Optional N— well region 84 is formed to increase the breakdown voltage of the device.

Figure 2:
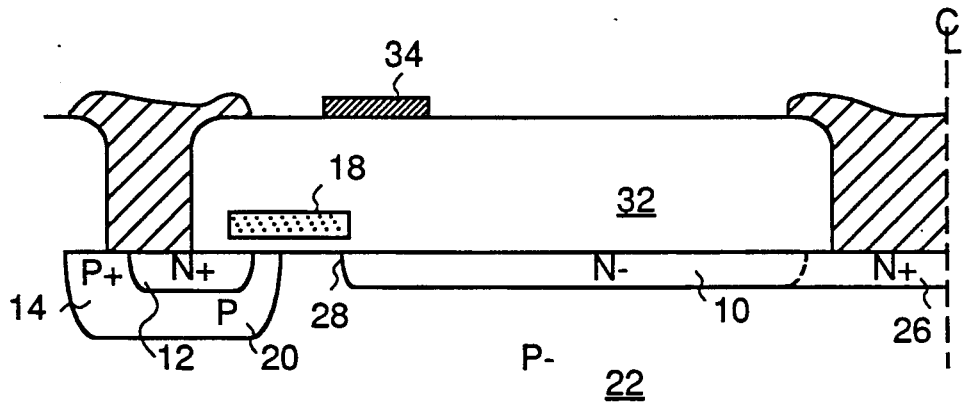
FIG. 2 is a second generation high voltage lateral DMOS transistor with a lightly doped drain not using LOCOS.

Operation of this active section of the DMOS transistor in FIG. 4a is similar to the operation of the DMOS transistor shown in FIG. 2, previously discussed.

The inactive portion of the DMOS transistor is shown as area 90 in FIG. 4c. In this area 90, field plate 78 is opened up to allow high voltage interconnect line 92 to contact N+ drain 60. A cross-section of this inactive portion of the DMOS transistor is shown in FIG. 4b. Area 90 corresponds with the location of field oxide region 94 in FIG. 4b. In FIG. 4b, a field oxide region 94, formed by a well known local oxidation of silicon (LOCOS) process, separates N— drift region 62 from the region under gate 64 so that the electric field strength near the tip of drift region 62 in FIG. 4b is not greater than the field strength at the tip of the drift region 62 in the active areas of the DMOS transistor.

In the embodiment illustrated in FIG. 4c, area 90 is shown with angled sides, however, area 90 may also be rectangular. The critical dimension in area 90 is the distance between interconnect line 92 and drift region 92 (under field plate 78) at the drift region/channel interface 79. This critical dimension should exceed one micron per every 15 volts of drain voltage. Hence, for a desired breakdown voltage of 300 volts, the critical dimension should exceed 20 microns. The general shape of area 90 in FIG. 4c is preferred since, where area 90 is made narrower toward drain 60, there is less field crowding due to the tip of drift region 62 being relatively distant from the channel region. The general shape of area 90 in FIG. 4c is preferred since it results in a minimum increase in on-resistance.

No additional masking steps are used to form field oxide region 94 since field oxide region 94 is formed along with other oxide regions on the wafer.

Field oxide region 94 is formed prior to gate formation and N— drift region 62 doping. As shown in FIG. 4b, gate 64 will overlie field oxide region 94. After field oxide region 94 and gate 64 are formed, a subsequent N-type implant procedure to form self-aligned N— drift region 62 in FIG. 4b will not dope the silicon underlying field oxide region 94. Therefore, N— drift region 62 will be discontinuous under the subsequently formed drain interconnect line 92. Thus, the effect of the high voltage on high voltage interconnect line 92 does not cause the DMOS device of FIG. 4c to have a lower breakdown voltage.

Figure 1:
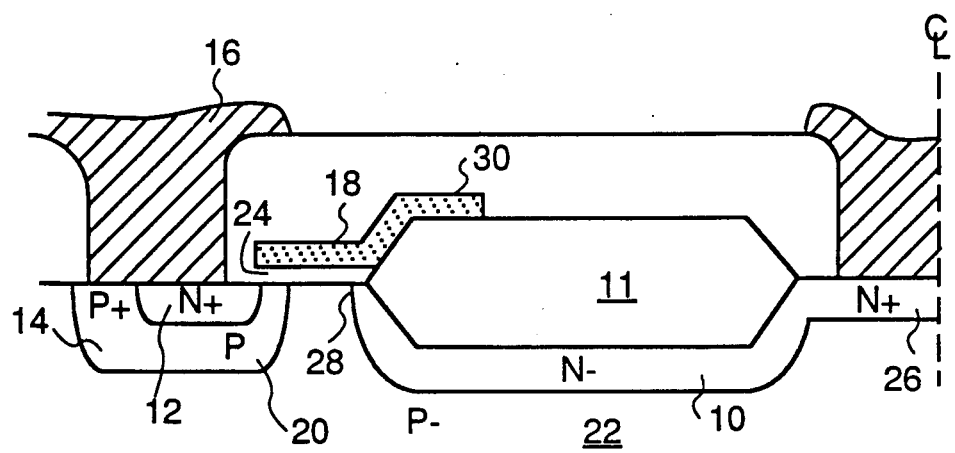
FIG. 1 is a cross-section of a first generation high voltage lateral DMOS transistor with a lightly doped drain using local oxidation of silicon (LOCOS).

Faults in the crystalline structure caused during the LOCOS process (discussed with reference to FIG. 1) to form field oxide region 94 do not affect breakdown voltage since these faults are not located where there is a large electric field.

The field plate 78 of FIG. 4a and FIG. 4c is not necessary for the DMOS transistor to operate for the benefits of our invention to be realized.

As is apparent, this technique of isolating a drift region from the channel region by an oxide region can be applied to many types of DMOS transistor structures.

Figure 5:
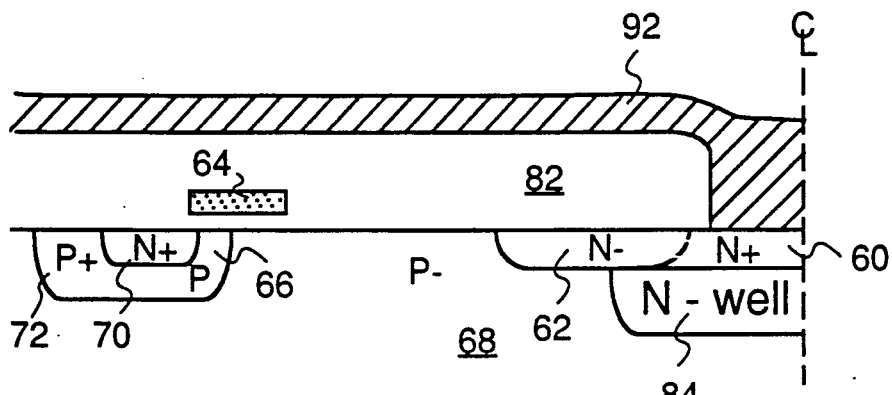
FIG. 5 is a cross-section of another embodiment of an inactive portion of the DMOS transistor of FIGS. 4a and 4c.

Shown in FIG. 5 is an alternative embodiment of the inactive portion of the DMOS transistor of FIGS. 4a and 4c. To form the embodiment of FIG. 5, an additional mask is used to eliminate a portion of the drift region under interconnect line 92 to form the inactive portion of the transistor. Since, normally, blanket doping is used to form self-aligned N— drift region 62 in FIG. 4a, a mask is required to block the N type dopants from entering the portion of silicon extending from the channel region to the some distance near N+ drain region 60.

As seen, N— drift region 62 may be partially or completely deleted from under high voltage interconnect 92 by either forming an oxide region such as field oxide region 94 in FIG. 4b, or by otherwise preventing N type dopants from being implanted in the silicon under where high voltage interconnect 92 is to be formed.

Dopant types may be opposite those shown in the illustrated embodiments without departing from the inventive concepts of this invention.

Figure 6A:
FIGS. 6a–6f show cross-sections of the inactive portion of our DMOS transistor during successive stages of fabrication.

One method of forming the DMOS transistor of FIG. 4c will now be discussed with reference to FIGS. 6a–6f. As shown in FIG. 6a, a semiconductor substrate 68, such as a P-type silicon wafer having a conductivity of approximately 12 to 80 ohm-cm, is used as the starting material. All conductivity types in this embodiment may be reversed, however. The doping of the substrate is determined by a variety of factors including the desired breakdown voltage of the LDD device. Next, an optional N-well 84 is formed, if necessary, to increase the breakdown voltage of the device. N-well 84 is formed using standard masking and implantation, or other doping, techniques. The masking for N-well 84 is noncritical.

Figure 6B:
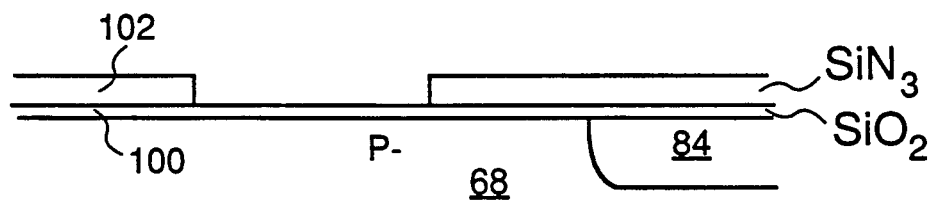

Next, procedures to form field oxide 94 in FIG. 4b will be conducted. As shown in FIG. 6b, base oxide layer 100 is grown to a thickness of approximately 500Å over the surface of the wafer by thermal oxidation, such as oxidation in oxygen for approximately 35 minutes at approximately 1,000° C. This base oxide acts to provide stress relief between the subsequently formed field oxide region and the silicon. On the surface of base oxide 100 is deposited silicon nitride layer 102 to a thickness of approximately 1,000–2,000Å. Silicon nitride layer 102 is deposited in a manner well known in the semiconductor arts, such as by a low pressure chemical vapor deposition (CVD) process. As shown in FIG. 6b, silicon oxide layer 102 is patterned utilized well-known photolithographic and etching techniques in order to pattern the layer to expose base oxide layer 100 where field oxide 94 is to be subsequently formed. Silicon nitride layer 102 is patterned, for example, by etching with $CF_4$ plasma.

Figure 6C:
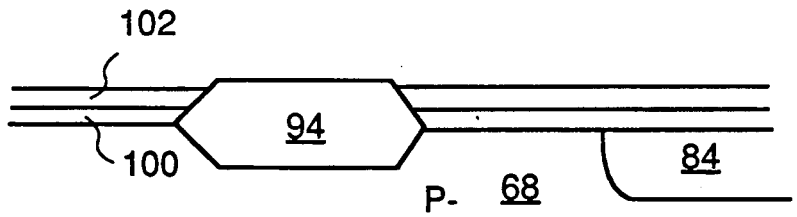

As shown in FIG. 6c, field oxide 94 is then thermally grown to a thickness of approximately 1–2 microns. Field oxide 94 is grown, for example, by oxidation in steam for 14 hours at approximately 1,000° C. During this field oxide growth, portions of the wafer where it is not desired to form field oxide are protected from oxidation by oxide layer 100 and nitride layer 102. Subsequent to the formation of field oxide 94, silicon nitride layer 102 is removed. For example, by etching with a $CF_4$ plasma. Oxide layer 100 is then removed, for example, by etching in buffered hydrofluoric acid. The thickness of field oxide 94 is reduced somewhat during the etching of oxide layer 100.

Figure 6D:
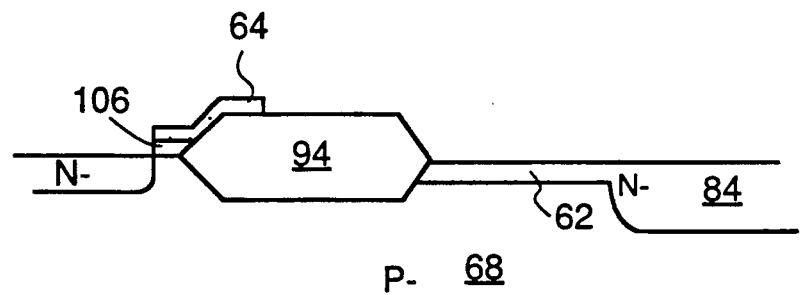

As shown in FIG. 6d, gate oxide 106 is then formed to a thickness of approximately 500–2,000Å by thermal oxidation in steam for approximately 15 minutes at approximately 1,000° C., for example. A layer of polycrystalline silicon to form gate 64 is then deposited on the surface of the wafer. The polycrystalline silicon is then doped to reduce its sheet resistance to approximately 30 ohms/square, for example, by doping with phosphorus by applying to the wafer $POCl_3$ for 12 minutes at approximately 970° C. The polycrystalline silicon layer is formed to a thickness of approximately 4,000–7,000Å by, for example, a low pressure CVD process.

The polycrystalline silicon layer is then patterned utilizing well-known masking techniques to form gate 64. The polycrystalline silicon may be etched with, for example, $CF_4$ plasma. The exposed gate oxide layer 106 is then etched with buffered hydrofluoric acid. The reader is reminded that field oxide 94 is only required in the area designated as area 90 in FIG. 4c. Elsewhere, not under area 90, the field oxide 94 is prevented from growth due to the layer of silicon nitride 102 over the surface of P− substrate 68. Therefore, elsewhere along the periphery of the DMOS transistor of FIG. 4c, gate 64 is similar to that shown in FIG. 4a.

Next, as shown in FIG. 6d, a blanket N type dopant implant is used to form drift region 62 using gate 64 and field oxide 94 as a mask. The implant dose to form N− drift region 62 is typically on the order of $10^{12}$ ions/cm$^2$. Everywhere but under area 90 in FIG. 4c, N− drift region 62 is similar to that shown in FIG. 4a.

Figure 6E:
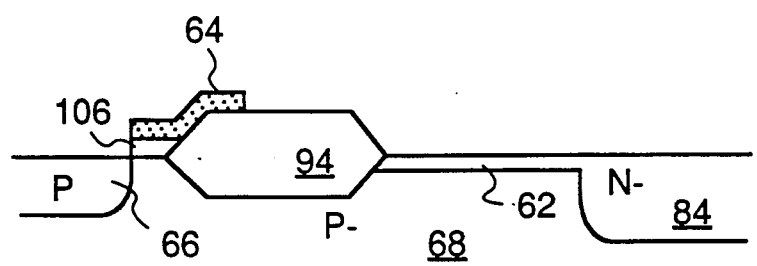

Next, as shown in FIG. 6e, the wafer is masked using well-known techniques, and P type dopants, such as boron, are implanted to form P body region 66. Thus, the P type dopants embedded into body region 66 counter-dope the N type drift dopant also in that area. As seen, gate 64 acts as a mask to self-align P body region 66.

The P body and N− drift implants are then diffused for 7–14 hours at a temperature of 1,100°–1,200° C., resulting in a P body junction depth of approximately 1.0–4.0 microns and an N− drift junction depth of approximately 0.5–2.5 microns.

Figure 6F:
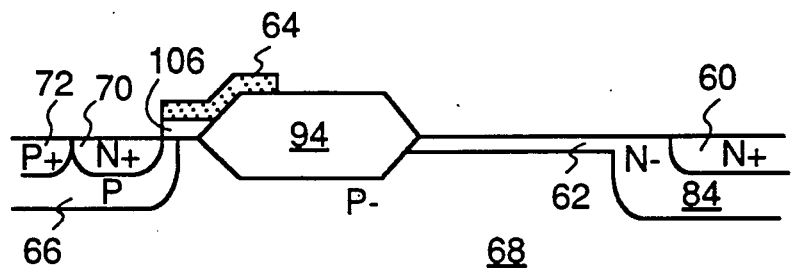

Next, as shown in FIG. 6f, the wafer is masked using well-known techniques to expose regions on the surface of the wafer where N+ source region 70 and N+ drain region 60 are to be formed. Slow diffusing N type dopants such as arsenic or antimony are implanted into the exposed regions to form highly doped N+ source region 70 and N+ drain region 60. As seen, N+ source region 70 is self-aligned with gate 64 by gate 64 being used as a mask.

Another mask is used to expose a region adjacent to N+ source region 70 to act as a P+ body contact region. P type dopants are then implanted into this body contact region 72.

Next, as shown in FIGS. 4a and 4b, field oxide 82 is grown over the surface of the wafer and over polysilicon gate 64, for example, by oxidation in steam for a period of time at approximately 1,000° C. until field oxide 82 reaches a desired thickness of approximately 1,000–3,000Å. During this time, the implanted N type source and drain dopants and the P type dopants in body contact region 72 are diffused, thus establishing the desired dopant profile within the substrate. In one embodiment, the junction depths in the P+ and N+ regions are approximately 0.5-2.0 microns, with sheet resistivities of 10–30 Ω/square for the N+ regions and 30–200 Ω/square for the P+ region 72.

The resulting diffusion of impurities will create the necessary difference in diffusion lengths under gate 64, essential for the creation of the DMOS transistor.

A thick oxide such as borophosphosilicate glass (BPSG) is then deposited to a thickness of 7,000 Å to 2 microns using well-known CVD techniques.

Contact holes are then etched to expose P+ body contact region 72 and N+ source region 70 and to expose N+ drain region 60. A metal deposition step is conducted to form contact 74, shorting P+ body region 72 to N+ source region 70, contact 76, field plate 78, and high voltage interconnect line 92.

The wafer is then passivated with, for example, silicon nitride and further processing is employed to form connections between the various metal electrodes and electrical terminals of the resulting integrated circuit.

It should be again noted that the process described above is for only one embodiment incorporating our invention. Our invention is adaptable to any process used to form an annular type DMOS transistor where a high voltage interconnect line is necessary to penetrate the periphery of the annular DMOS transistor to contact a central drain region.

While specific embodiments have been disclosed in this specification, these embodiments are merely illustrative of our invention and are not to be construed as limitations of our invention. Other embodiments of our invention will become apparent to those skilled in the art in light of the teachings of our invention.

We claim:

1. An annular-shaped or rectangular-shaped DMOS transistor comprising:
   a substrate of a first conductivity type having a top surface;
   a drain region of a second conductivity type formed on and below said top surface of said substrate;
   a drift region of a second conductivity type formed on and below said top surface of said substrate, said drift region contacting and substantially surrounding said drain region;
   a body region of a first conductivity type formed on and below said top surface of said substrate, said body region surrounding said drift region and being separated from said drift region by a portion of said substrate;
   a source region of a second conductivity type formed within said body region;
   a gate oxide layer formed on said top surface of said substrate over a channel region between said source region and a termination point of said drift region;
   a control gate formed over said gate oxide layer;
   a first electrode contacting and shorting together said body region and said source region;
   a second electrode contacting said drain region and forming an interconnect line extending over a portion of said control gate, said body region, and said source region; and
   an inactive region located in an area under said interconnect line and extending out from under said interconnect line, said inactive region being an area where said drift region terminates at a distance from said channel region to reduce field crowding under said interconnect line.

2. The DMOS transistor of claim 1 further including circuit means for applying a voltage between said source region and said drain region, said circuit means at least intermittently applying a voltage $V_{DS}$ between said source region and said drain region, the voltage applied between said source region and said drain region never exceeding $V_{DS}$, wherein the smallest distance between said drift region and said interconnect line at a point where said drift region terminates at said channel region under said gate, expressed in microns, is equal to or greater than $V_{DS}$ divided by 15 volts.

3. The DMOS transistor of claim 1 wherein said inactive region is formed by an oxide region overlying said substrate interposed between said channel region and said drift region, said oxide region being thicker than said gate oxide layer, at least a portion of said control gate extending over said oxide region.

4. The DMOS transistor of claim 3 wherein said inactive region comprises a region of said substrate of said first conductivity type.

5. The DMOS transistor of claim 1 wherein the smallest distance between said drift region and said interconnect line at a point where said drift region terminates at said channel region under said gate is such that voltage breakdown will not occur in said DMOS transistor solely by reason of said field crowding produced by said interconnect line.

* * * * *